United States Patent [19]

Irikawa et al.

[11] Patent Number: 5,932,890
[45] Date of Patent: Aug. 3, 1999

[54] FIELD EFFECT TRANSISTOR LOADED WITH MULTIQUANTUM BARRIER

[75] Inventors: Michinori Irikawa, Yokohama; Kenichi Iga, Tokyo-to, both of Japan

[73] Assignee: The Furukawa Electric Co., Ltd., Toyko, Japan

[21] Appl. No.: 08/884,319

[22] Filed: Jun. 27, 1997

Related U.S. Application Data

[63] Continuation of application No. 08/416,015, Apr. 3, 1995, abandoned, which is a continuation-in-part of application No. 08/057,759, May 7, 1993, abandoned.

[30] Foreign Application Priority Data

May 8, 1992 [JP] Japan ..................................... 4-143418

[51] Int. Cl.⁶ .................................................. H01L 29/06
[52] U.S. Cl. .............................. 257/15; 257/14; 257/194
[58] Field of Search .................................... 257/194, 280, 257/14, 15, 12, 17, 18

[56] References Cited

U.S. PATENT DOCUMENTS 5,192,987 3/1993 Khan et al. ........................... 257/183.1

FOREIGN PATENT DOCUMENTS 62-213279 9/1987 Japan .

Primary Examiner—Olik Chaudhuri
Assistant Examiner—Nathan K. Kelley
Attorney, Agent, or Firm—Jacobson, Price, Holman & Stern, PLLC

[57] ABSTRACT

A field effect transistor having an excellent transfer conductance and an improved gate leakage current and breakdown voltage is provided. In the transistor, a multiquantum barrier structure 4 is arranged between a gate and a channel layer 3 along a channel layer 3 and having an effect of reflecting incident overflowing carriers a s waves in with with phase conditions of total reflection allowing mutual enhancement of the incident and reflected wave in a region between a channel layer 3 and a gate electrode 10 and/or in a region opposite to the gate electrode 10 relative to the channel layer 3.

3 Claims, 5 Drawing Sheets

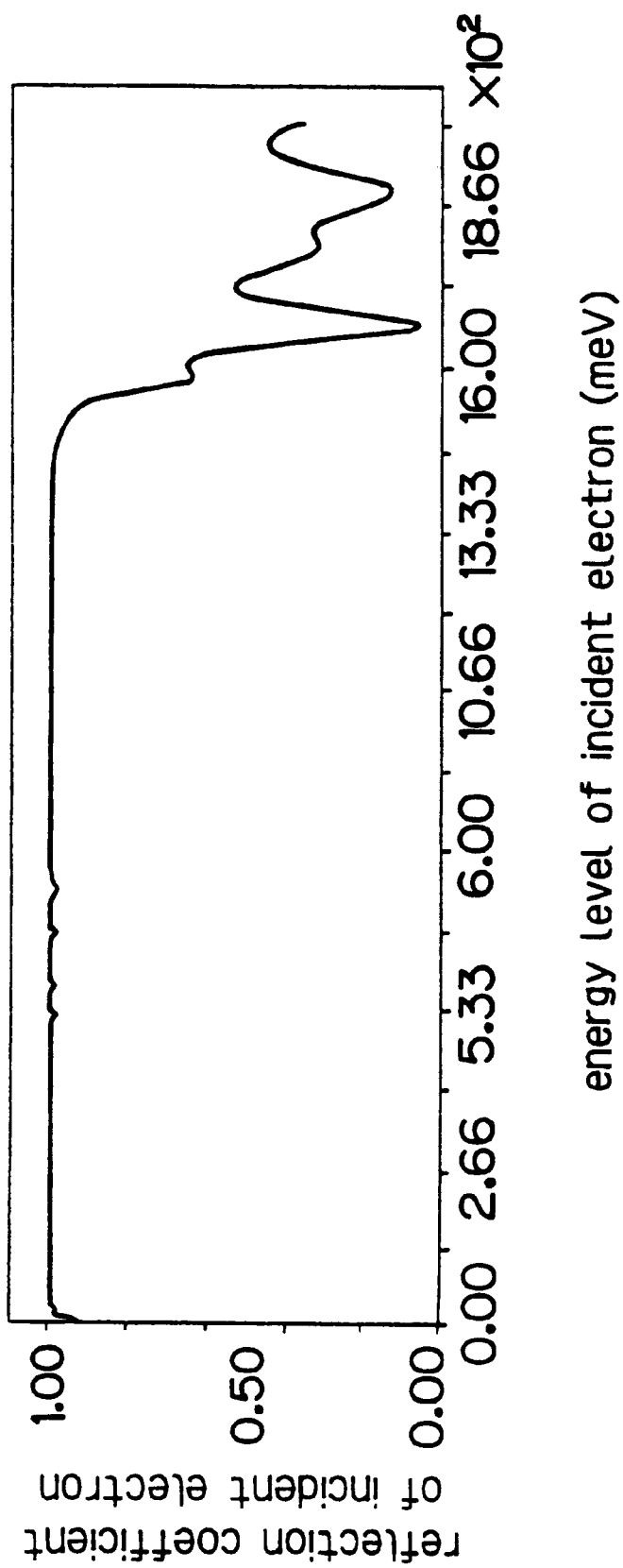

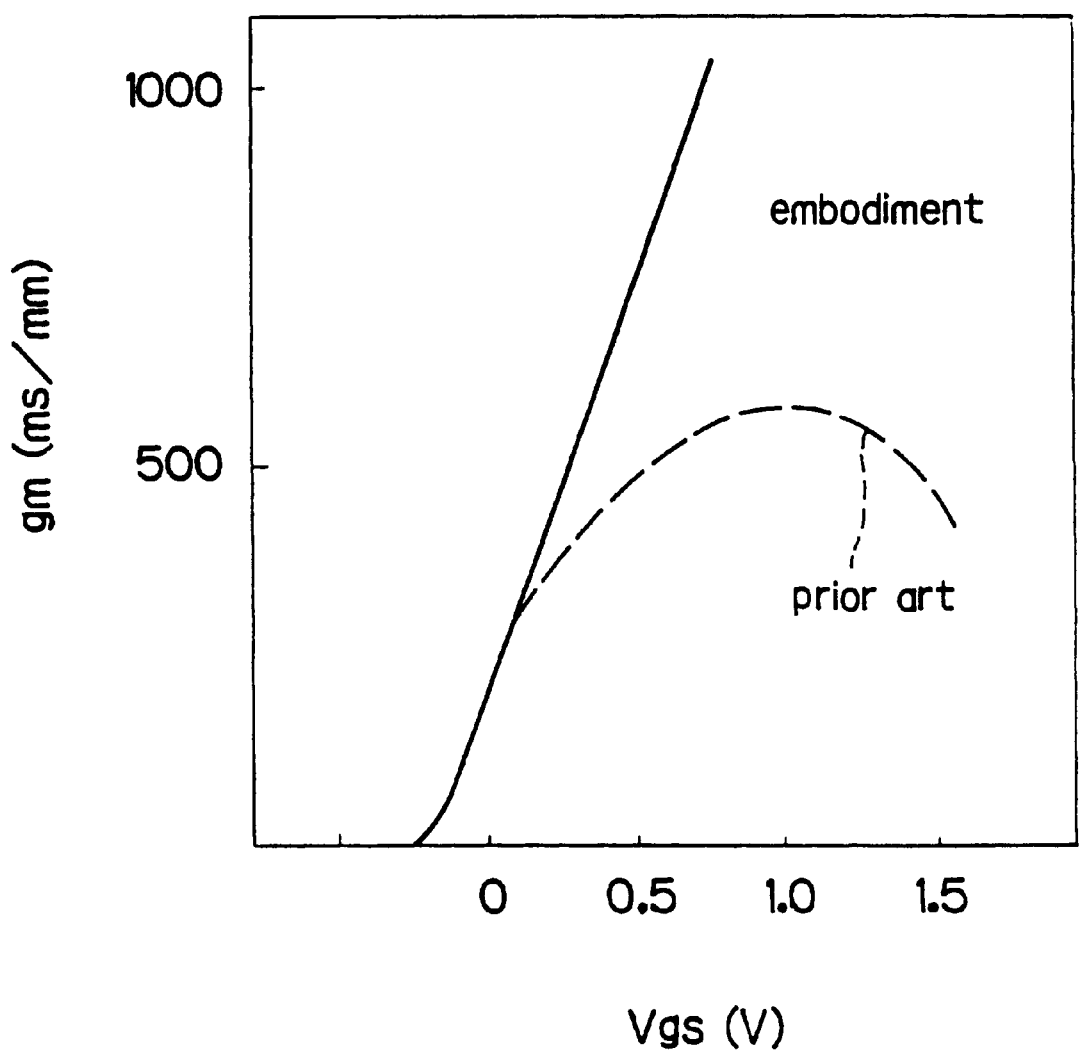

FIELD EFFECT TRANSISTOR LOADED WITH MULTIQUANTUM BARRIER

This application is a continuation of application Ser. No. 08/416,015, filed Apr. 3, 1995, abandoned, which is a continuation-in-part application of Ser. No. 08/057,759, filed May 7, 1993, abandoned.

BACKGROUND OF THE INVENTION

1. Field of the Invention

This invention relates to a multiquantum barrier field effect transistor (FET) having improved and distinguished characteristics.

2. Prior Art

High-electron mobility transistors (HEMTs) are attracting large interest for their excellent functional features such as high operating speed and low power consumption.

An HEMT device having a channel layer of $Ga_xIn_{1-x}As$ is expected to have a promising future because of its enhanced mobility in a low electric field, large saturation velocity, large band gap in a heterointerface and other outstanding characteristics in terms of current gain and cut-off frequency. Some of the papers reporting on this type of device include the following:

Paper No. 1: U. Mishra et al., IEEE, EDL, 9.41 (1988)

Paper No. 2: J. Kuang et al., Appl. Phys. Lett. 57, 1785 (1990)

3. Problems to be Solved by the Invention

An HEMT device having a channel layer of $Ga_xIn_{1-x}As$ is, however, accompanied by certain problems to be solved as described below.

Firstly, the relationship between the transfer conductance gm and the gate-source voltage Vgs of such a device exhibits a saturation at a certain Vgs($V_s$) and the value of gm tends to decrease in Vgs region larger than Vgs($V_s$).

Secondly, a device under consideration has a low-drain breakdown voltage due to large gate-leakage current. Incidentally, an AlGaAs/GaAs type device has a drain breakdown voltage of 7V, whereas an InGaAs/AlInAs type device shows a drain breakdown voltage of 4 to 6V.

On the other hand, Paper No. 3 as quoted below reports that the gm-Vgs relationship of a GaAs/InGaAs/AlGaAs type device can be improved by increasing the conduction band edge discontinuity ΔEc between AlGaAs and InGaAs increasing Al content of AlGaAs layer.

Paper No. 3: Col. of Papers for 1992 spr., Ins. of Electronic Information and Telecommunication, 29p-ZP-6 (1992)

In InGaAs/AlInAs HEMT device, as is clearly shown in Paper No. 2 listed above and in FIG. 3 of the accompanying drawings of this specification, a large gm has been achieved and the breakdown has been improved by arranging its electron supplying layer as a modulation doped structure with a nondoped AlInAs layer and increasing the barrier height of the electron supplying layer. However, the tendency of easy saturation of gm and the tendency of lowering of gm in a large gate-source voltage can not be improved by such an arrangement.

There has been reported in Paper No. 5 as listed below that gm and other characteristics of a device of the type under consideration can be improved by using a GaInAs strained channel layer, lowering the conduction band edge of the channel and raising the heterobarrier height, i.e., the conduction band edge discontinuity ΔEc.

All these reports reveal a fact that the intrinsic performances of the device of type under consideration can be improved by (1) increasing the heterobarrier height and realizing sufficient confinement of two-dimensional electron gas into the channel layer, (2) increasing the gate Shottky barrier height and reducing the gate-leakage current. However, the conventional technique as described in Paper No. 2 quoted above does not provide any satisfactory improvement because gm tends to be easily saturated.

It is, therefore, an object of the present invention to provide an HEMT which is free from the material restrictions such as the electron affinities and other constants specific to the materials which take part in determining the barrier height of the electron supplying layer against the channel layer and the barrier height of the gate Schottky contact. By a sufficiently large barrier height, carriers can be satisfactorily confined to the channel layer and the gate-leakage current can be well suppressed so that the device can show excellent characteristics in terms of transfer conductance, breakdown voltage and other characteristics.

SUMMARY OF THE INVENTION

According to the invention, the above object and other objects of the invention are achieved by providing multiquantum barrier (MQB) arranged along a channel layer of HEMT, or more generally, along a channel layer of FET.

MQB can reflect the carriers overflowing from channel layer to carrier supplying layer or from gate metal to the channel (drain).

MQB(s) is (are) loaded between gate electrode and channel along channel, or both sides of channel layer along channel layer.

Here, the multiquantum barrier structure of a transistor according to the invention preferably comprises a strained superlattice layer.

Here, the principle and designing method of MQB are described in detail.

As is known well in quantum mechanics, the incident wave and the reflected (scattered) wave of a particle which collides with a potential well or a potential barrier can interfere so long as they are coherent[1].

(1) Quantum Mechanics, L. A. Schiff. (McGraw-Hill, N.Y. 1955)

Similarly, in semiconductor material, an electron wave which incidents upon a superlattice structure can also interfere with its reflected wave so that the total reflection (reflectivity=1) can be realized, if suitable conditions are satisfied. This is a concept of MQB (Paper 4), as is shown in FIG. 5($a$).

The model and designing procedures are summarized as follows:

(1) The potential model described by the conduction band edge discontinuity (FIG. 5($b$)).

(2) One dimensional Schroedinger equation under effective mass approximation, where the parabolic band model, i.e., $(E-V)=(\hbar k)^2/2m^*$ is usually assumed (Eq (1)).

$$\left[-\frac{\hbar^2}{2} \cdot \frac{d}{dx} \cdot \frac{d}{mj^*} \cdot \frac{d}{dx} + V(x)\right] u_j(x) = Eu_j(x), \quad \text{Eq (1)}$$

$$u_j(x) = A_j e^{ikj(x-x_{j-1})} + B_J e^{-ikj(x-x_{j-1})},$$

$$k_j = \sqrt{\frac{2m_j^*}{\hbar^2}(E-V_J)}$$

(3) Transfer matrix method, where the boundary conditions are i) continuity of probability density and ii) continuity of flux (Eq (2)).

$$\begin{cases} u_{j-1}(x_{j-1}) = u_j(x_{j-1}), \\ \dfrac{1}{m^*_{j-1}} \cdot \dfrac{d}{dx}[u_{j-1}(x_{j-1})] = \dfrac{1}{m^*_j} \cdot [u_j(X_{j-1})] \end{cases} \quad \text{Eq (2)}$$

This method gives the reflectivity R(E) of an incident carrier as a function of energy E of an incident carrier, layer thickness, potential height, effective mass of carrier for each layer consisting of the MQB structure.

Thus, by calculating reflectivity R(E) as a function of incident energy E, we can obtain a reflection spectrum for a certain MQB structure, and therefore, we can design the optimal MQB structure.

Paper No. 4: K. Iga et al., Electron. Lett. 22, 1008 (1986)

The present invention consists in applying the above feature of a multiquantum barrier to a field effect transistor. More specifically, (1) the carrier overflow from the channel layer in a transistor of the type under consideration is suppressed by MQB in order to consequently prevent the tendency of saturation of gm in the gm-Vgs relationship and to realize a large gm in a large electric current, and (2) the gate leakage current due to the thermionic emission of electrons from gate metal to gate contact semiconductor layer is also suppressed in order to realize the high-drain breakdown voltage.

With regard to the drain breakdown voltage, one of the dominant reasons for the noticeably low drain breakdown voltage of a conventional HEMT can be attributed to the gate leakage current given rise to by electrons injected from the gate toward the drain and the channel near the drain, because the potential difference between the gate and the drain is maximized when the gate is biased to lowest voltage to give current-off condition.

According to the invention, such a low drain breakdown voltage due to a leak current can be effectively eliminated by providing the Schottky gate contact layer with an MQB structure with sufficiently high effective barrier height against the gate Schottky metal.

Then, the volume of electrons injected from the gate toward the drain and the channel is significantly reduced to consequently raise the drain breakdown voltage.

Now, the present invention will be described in greater detail by referring to the accompanying drawings that illustrate preferred embodiments of the invention.

BRIEF DESCRIPTION OF THE DRAWINGS

FIG. 2 is a graph showing the relationship between the energy level of incident electrons and the reflection coefficient of incident electrons for the multiquantum barrier layer of the embodiment of FIG. 1(a).

FIG. 3 is a graph showing the relationship between transconductance gm and gate-source voltage Vgs of the embodiment of FIG. 1(a).

DETAILED DESCRIPTION OF THE INVENTION

Embodiment 1

Figure 1A:
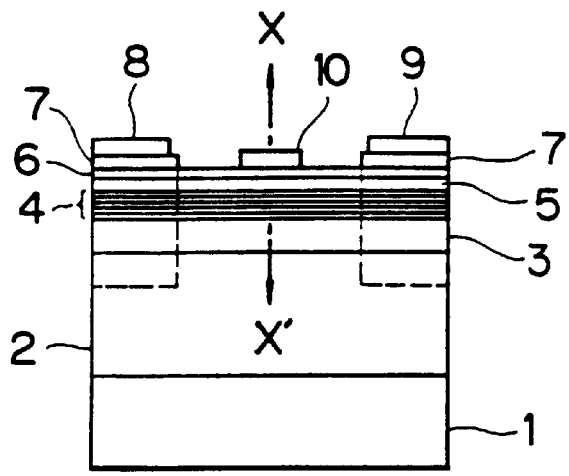
FIG. 1(a) is a schematic cross sectional view of a first embodiment of multiquantum barrier transistor of the present invention.

FIG. 1(a) is a schematic sectional view of a first embodiment of multiquantum barrier gate transistor of the present invention, which is in fact an HEMT of an InGaAs/InAlAs system and comprises a semi-insulating InP substrate 1, a 300 nm thick undoped $Al_xIn_{1-x}As$ (x=0.48) buffer layer 2, an 80 nm thick undoped $Ga_xIn_{1-x}As$ (x=0.47) channel layer 3, a multiquantum barrier layer 4, a 30 nm thick $n^+$-$Al_xIn_{1-x}As$ (x=0.48) supply layer 5, a 20 nm thick undoped $Al_xIn_{1-x}As$ (x=0.48) gate contact layer 6, a 20 nm thick $n^+$-$Ga_xIn_{1-x}As$ (x=0.47) ohmic layer 7, an AuGe/Ni/Au source electrode 8, an AuGe/Ni/Au drain electrode 9 and a TiPt/Au gate electrode 10.

The multiquantum barrier layer 4 of the above embodiment comprises a 6-monolayers (ML) thick undoped $Ga_xIn_{1-x}As$ (x=0.47) well layer 41, an undoped $Al_xIn_{1-x}As$ (x=:0.62) barrier layers 42 consisting of six (6) 4-ML thick layers, each having a 1% in-plane tensile strain, and a (1) 15-ML thick layer also having a 1% in-plane tensile strain and a lattice-matched $Al_xIn_{1-x}As$ (x=:0.48) barrier layer 43.

Some of the theoretical aspects and the effects of using a strained superlattice structure in an MQB are disclosed by inventors of this application in Japanese Patent Laid-open Publication No. Hei 5-7051 and Paper No. 5 listed below.

Paper No. 5: M. Irikawa et al., Jpn. J.Appl.Phys. 31 (1991) L.1351

The changes of the energy level at the conduction band edge are reported in Paper No. 6 as listed below.

Paper No. 6: F. L. Schuermeyer et al., Appl. Phys. Lett. 55, 1877 (1989)

According to the Paper, and $Al_xIn_{1-x}As$ barrier layer having a 1% tensile strain against InP shows a barrier height conduction height conduction band edge discontinuity of approximately 770 meV against GaInAs.

Figure 1B:
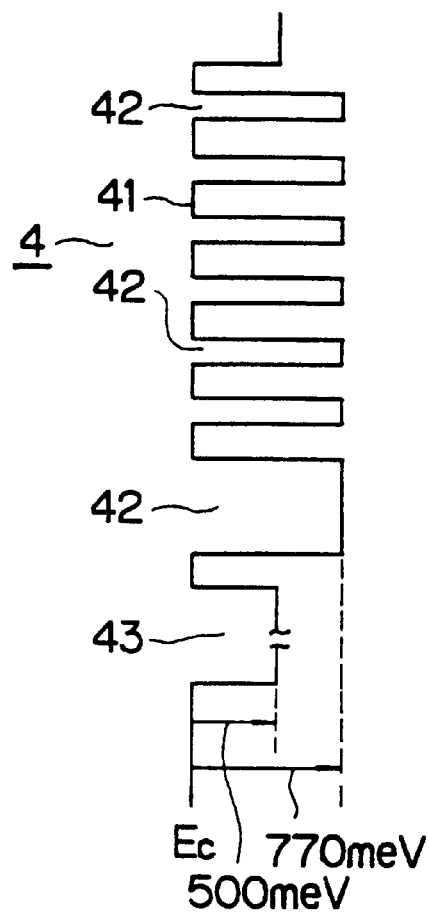
FIG. 1(b) is a schematic illustration of the energy bands for conduction band edge of the multiquantum barrier layer of the embodiment of FIG. 1(a).

The inventor of the present invention calculated the effective barrier height of an MQB having a configuration as illustrated in FIG. 1(b) by using a transfer matrix method (TMM) described in Paper No. 7 as listed below.

Paper No. 7: B. Jonsson et al., IEEE J. Quantum Electron., QE-26, 2025 (1990)

FIG. 2 illustrates the result of the calculation.

Referring to FIG. 2, the effective barrier height of the MQB under consideration is approximately 1,500 meV in view of the energy level and the reflection coefficient of incident electrons, showing an increase of 740 meV against the actual barrier height 770 meV and proving a barrier height approximately 1.0 eV higher than that of lattice-matching AlInAs against GaInAs or 510 meV.

Such an enhanced effective barrier height shows a remarkable effect on the leakage current due to overflowing carriers injected from the channel layer to the gate-side electron supplying layer as described below.

Figure 1C:
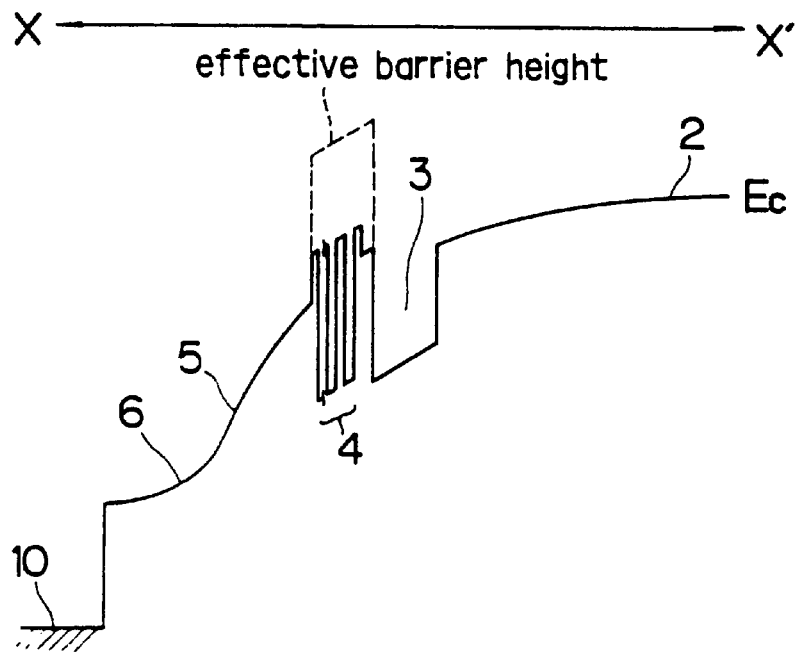
FIG. 1(c) is a schematic illustration of the energy bands for conduction band edge of the embodiment of FIG. 1(a), when a positive voltage is applied to the gate to give current-on stage.

FIG. 1(c) schematically illustrates the energy band of the embodiment of FIG. 1(a) observed when a positive voltage is applied to the gate.

The amount of overflowing electrons from the channel layer 3 to the electron supplying layer 5 can be explained by the thermionic emission theory as in the case of injection of electrons from a metal to a semiconductor at a Schottky junction and given by formula (1) below as it may be obvious if Paper No. 8 listed below is referred to.

Paper No. 8: P. Collot et al., Appl, Phys. Lett. 58, 367 (1991)

$$J \alpha \exp(-q \phi/kT) \quad (1)$$

where $\phi$ is the barrier height.

From the equation (1) above, the leakage current will be reduced by $\exp(-1000/26)=2\times10^{-17}$ of $1^7$ figure when compared with that of a conventional structure (lattice-matched AlInAs).

Thus the tendency of saturation and reduction of gm in the gm-Vgs relationship is suppressed to realized a high gm in a high-electric current as typically shown in FIG. 3.

Consequently, large improvement is expected on the current driving capability and on logic swing for digital applications.

While AlInAs layers having a 1% tensile strain were used for the barrier layers in the above described first embodiment, they may alternatively consist of lattice-matched AlInAs. Similarly, InP or GaInAsP may alternatively be used for the well layers of the embodiment.

As may be obvious from FIG. 1(c), an MQB structure may also be used for the buffer layer side in order to suppress the overflow of electrons to the buffer layer side.

Embodiment 2

The second embodiment of the invention is consisting of InGaAs/AlGaAs HEMT and has layers similar to those of the first embodiment but realized by replacing them as described below.

The InP substrate and the undoped $Al_xIn_{1-x}As$ (x=0.48) buffer layer of the first embodiment are respectively replaced by a semi-insulating GaAs layer and an undoped GaAs buffer layer in the second embodiment. The lattice-matched GaInAs channel is replaced by strained $Ga_xIn_{1-x}As$ (x=0.1) channel.

The multiquantum barrier layers of the second embodiment comprises $Al_{0.25}Ga_{0.75}As$ barrier layers of different thicknesses (a (1) 60 ML layer, a (1) 15 ML layer, six (6)—4 ML layers) and nine (9)—GaAs well layers of 4 ML.

The $N^+$-$Al_xIn_{1-x}As$ (x=0.48) supplying layer and the undoped $Al_xIn_{1-x}As$ (x=0.48) gate contact layer of the first embodiment are respectively replaced by an $n^+$-GaInP supplying layer and an undoped AlGaAs gate contact layer.

Finally, the $n^+$-$Ga_xIn_{1-x}As$ (x=0.47) ohmic contact layer of the first embodiment is replaced by an $n^+$-GaAs ohmic contact layer in the second embodiment. The layers are arranged in the above-mentioned order.

The second embodiment shows an effect similar to that of the first embodiment.

Embodiment 3

Figure 4A:
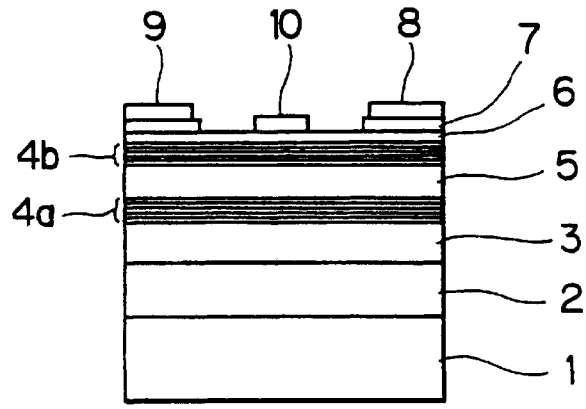
FIG. 4(a) is a schematic sectional view of a third embodiment of multiquantum barrier gate transistor of the present invention.

While a third embodiment of the present invention is illustrated in FIG. 4(a). Here, the material system is same as that of the first embodiment. However, two MQBs disposed respectively along the channel 3 and the gate electrode 10.

In the HEMT illustrated in FIG. 4(a), the MQB 4a disposed along the channel 3 reflects carriers overflow from the channel 3 to the gate electrode 10 as was described in the first embodiment. On the other hand, the MQB 4b disposed along the gate electrode 10 reflects electrons injected from the gate to channel near the drain electrode 9 when the gate has a potential close to that of the source.

Figure 4B:
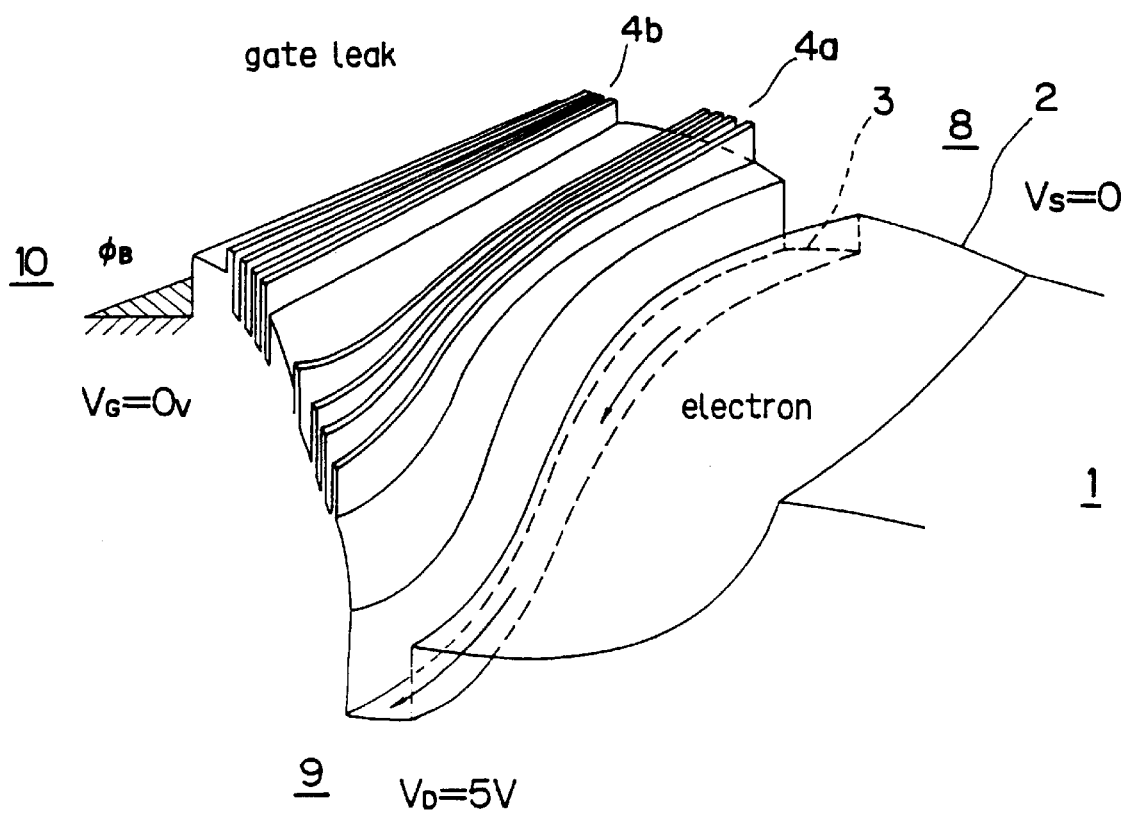
FIG. 4(b) is a schematic illustration of the structural features of the energy bands for conduction band edge of embodiment of FIG. 4(a).
Figure 5A:
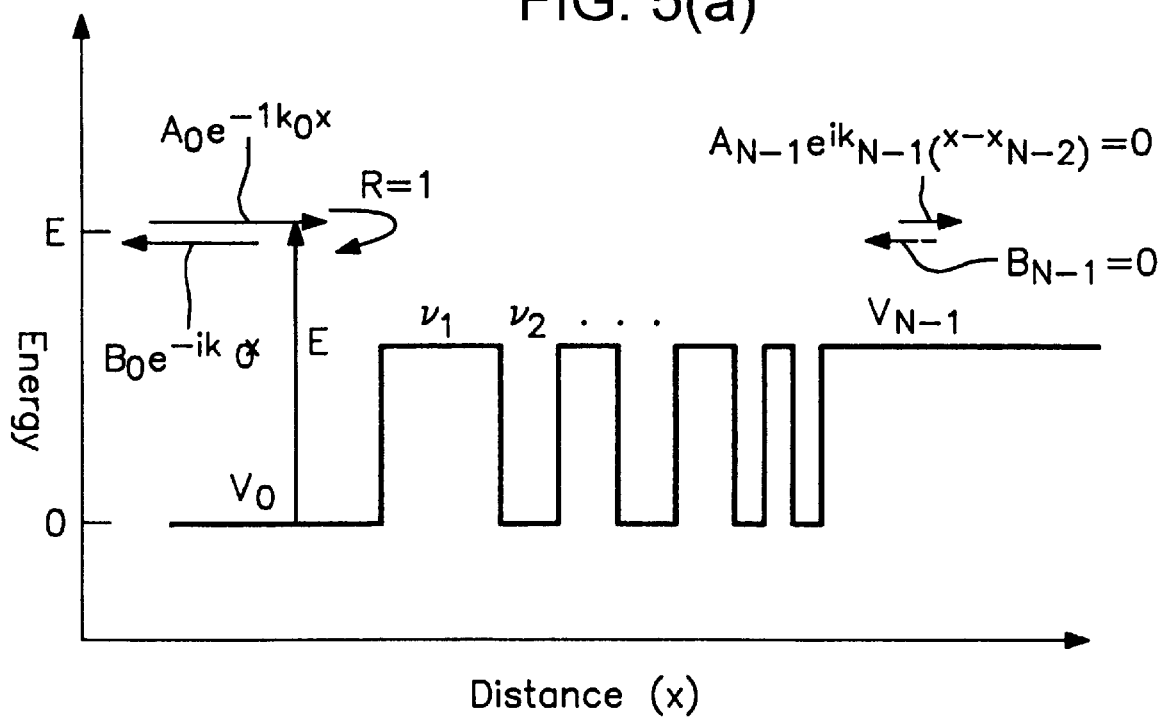
FIG. 5(a) is a schematic illustration of a concept of the MQB.
Figure 5B:
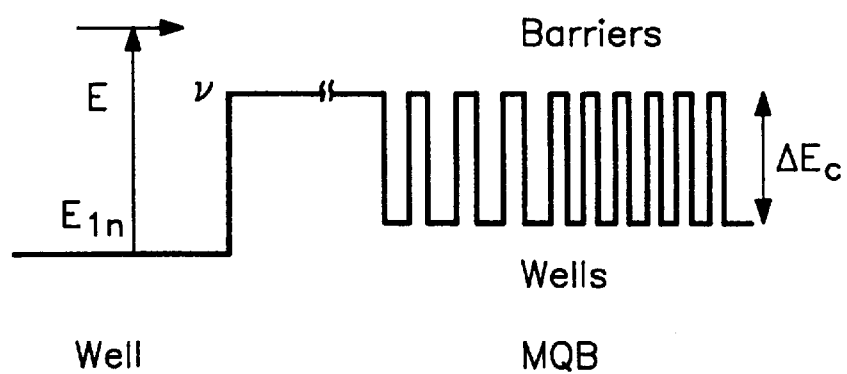
FIG. 5(b) is a schematic illustration of one-dimensional potential model of the MQB.

FIG. 4(b) is a schematic illustration of the energy band diagram for conduction band edge for the third embodiment.

The function of the second MQB 4b is to realize sufficiently high effective barrier height for the gate Schottky junction, enough to reduce gate leakage current described above.

The theory underlying the use of a second MQB is described in the above cited Japanese Patent Laid-open Publication No. Hei 5-7051.

The concept of the present invention can be applied not only to HEMTs but also to FET, SIS- and MIS-type transistors in the insulating layer of any of them in order to reduce the gate leakage current.

Additionally, the concept of the present invention can be applied not only to field effect transistors consisting of other compound materials than described above, but also ti Si/Ge, FET and to any Si-MOSFETs which are accompanied by the problem of injection of hot electrons into the gate insulating layer.

The MQB of a transistor of either of the above cited two types may alternatively comprise an $Si_xGe_{1-x}/Si$ strained superlattice layer.

As described above in detail, since a multiquantum barrier transistor according to the invention comprises a multiquantum barrier structure arranged along a channel layer and having an effect of reflecting incident carriers as waves in phase conditions capable of allowing mutual enhancement of the incident and reflected waves in a region between a channel layer and a gate electrode and/or in a region opposite to the gate electrode relative to the channel layer, the overflow of carriers from the channel layer and injection of electrons from the gate metal toward the drain are suppressed to consequently improve the transfer conductance, gate leakage current and the breakdown voltage of the transistor.

What is claimed is:

1. A field effect transistor comprising a substrate, a buffer layer provided on said substrate, a channel layer, a multiquantum barrier along said channel layer, a gate contact layer, a gate electrode, a source electrode and a drain electrode, said multiquantum barrier being between said gate and said channel layer and having an effect of reflecting incident carriers as waves in phase conditions capable of allowing mutual enhancement of incident and reflected waves in a region between said channel layer and said gate electrode and/or in a region opposite said gate electrode relative to said channel layer, the overflow of carriers from said channel layer and injection of electrons from said gate toward said drain being suppressed to consequently improve transfer conductance, gate leakage current and breakdown voltage of said transistor.

2. The field effect transistor according to claim 1, wherein said multiquantum barrier structure comprises a strained superlattice.

3. The field effect transistor according to claim 1, wherein a second multiquantum barrier is arranged between said gate and said channel layer.

* * * * *